(12) United States Patent
Jiao

(10) Patent No.: US 9,755,162 B2
(45) Date of Patent: Sep. 5, 2017

(54) ORGANIC LIGHT EMITTING DEVICE AND DISPLAY DEVICE

(71) Applicant: BOE TECHNOLOGY GROUP CO., LTD., Beijing (CN)

(72) Inventor: Zhiqiang Jiao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/347,866

(22) PCT Filed: Nov. 13, 2013

(86) PCT No.: PCT/CN2013/087039
§ 371 (c)(1),
(2) Date: Mar. 27, 2014

(87) PCT Pub. No.: WO2014/187082
PCT Pub. Date: Nov. 27, 2014

(65) Prior Publication Data
US 2015/0144894 A1    May 28, 2015

(30) Foreign Application Priority Data

May 21, 2013 (CN) .......................... 2013 1 0190245

(51) Int. Cl.
*H01L 51/00* (2006.01)
*H01L 51/52* (2006.01)
*H01L 51/50* (2006.01)

(52) U.S. Cl.
CPC ...... *H01L 51/0078* (2013.01); *H01L 51/0091* (2013.01); *H01L 51/0092* (2013.01);
(Continued)

(58) Field of Classification Search
CPC .................................................. H01L 51/5072
(Continued)

(56) References Cited

U.S. PATENT DOCUMENTS 6,097,147 A * 8/2000 Baldo et al. .................. 313/506
2002/0180347 A1* 12/2002 Adachi ................ H01L 51/005
313/503

(Continued)

FOREIGN PATENT DOCUMENTS

CN    103296215 A    9/2013
JP    2006-012793 A    1/2006
(Continued)

OTHER PUBLICATIONS

Chih-Chih et al., The study of blue organic light emitting diodes with a CuPc electron transporting layer. 2003.*
(Continued)

*Primary Examiner* — Mohsen Ahmadi
*Assistant Examiner* — David Spalla
(74) *Attorney, Agent, or Firm* — Ladas & Parry LLP

(57) ABSTRACT

An organic light emitting device and a display device is provided. The organic light emitting device includes an anode, a cathode, and a light emitting layer disposed between the anode and the cathode; an electron transport layer disposed between the cathode and the light emitting layer, and the material of the electron transport layer is an organic metal chelate.

12 Claims, 2 Drawing Sheets

(52) U.S. Cl.
CPC ...... *H01L 51/5004* (2013.01); *H01L 51/5206* (2013.01); *H01L 51/5056* (2013.01); *H01L 51/5072* (2013.01); *H01L 51/5092* (2013.01); *H01L 2251/552* (2013.01)

(58) Field of Classification Search
USPC .......................................................... 257/98
See application file for complete search history.

(56) References Cited

U.S. PATENT DOCUMENTS

| | | | |
|---|---|---|---|
| 2004/0197601 | A1 | 10/2004 | Thompson et al. |
| 2004/0222737 | A1* | 11/2004 | Raychaudhuri ..... H01L 51/5092 313/504 |
| 2005/0260447 | A1 | 11/2005 | Brooks et al. |
| 2009/0102359 | A1* | 4/2009 | Miyata .................. B82Y 20/00 313/504 |
| 2010/0289008 | A1* | 11/2010 | Jang .................... H01L 51/5052 257/40 |
| 2012/0061707 | A1* | 3/2012 | Seo et al. ......................... 257/98 |
| 2013/0291930 | A1* | 11/2013 | Braun .................. C09B 47/045 136/252 |
| 2015/0054014 | A1 | 2/2015 | Seo et al. |

FOREIGN PATENT DOCUMENTS

| | | |
|---|---|---|
| JP | 2006-114452 A | 4/2006 |
| JP | 2006-173588 A | 6/2006 |
| KR | 20030080056 A | 10/2003 |
| KR | 20120028232 A | 3/2012 |

OTHER PUBLICATIONS

Chih-Chih Lin, et al; "The Study of Blue Organic Light Emitting Diodes With A CUPC Electron Transporting Layer", Published in: Lasers and Electro-Optics, 2003. CLEO/Pacific Rim 2003, The 5th Pacific Rim Conference on (vol. 2) Dec. 15-19, 2003, 1 page.

Jiao Zhi-Qiang, et al; "Improved performance of organic light-emitting diodes with dual electron transporting layers", Chinese Physical B Society and IOP Publishing Ltd., vol. 21, No. 9, Jun. 2012, 4 pages.

Second Chinese Office Action Appln. No. 201310190245.0; Dated Oct. 18, 2014.

Chinese Rejection Decision Appln. No. 201310190245.0; Dated Feb. 27, 2015.

Korean Office Action Appln. No. 10-2014-7010145; Dated Mar. 30, 2015.

Korean Examination Opinion Appln. No. 10-2014-7010145I Dated Oct. 28, 2015.

International Preliminary Report on Patentability Appln. No. PCT/CN2013/087039.

Korean Office Action dated Apr. 28, 2016; Appln. No. 10-2014-7010145.

Chih-Chih Lin, et al; "The Study of Blue Organic Light Emitting Diodes With A CuPc Electron Transporting Layer", Cleo/Pacific RIM 2003—The 5th Pacific Rim Conference on Lasers and Electro-Optics Dec. 15-19, 2003, Piscataway, NJ, USA,IEEE; vol. 2, Dec. 15, 2003, p. 722; XP010690140.

Jiao Zhi-Qiang, et al; "Improved performance of organic light-emitting diodes with dual electron transporting layers", Chinese Physics B, Bristol GB, vol. 21, No. 6, Jun. 14, 2012; p. 67202, XP020224580.

Extended European Search Report dated Jul. 27, 2016; Appln. No. 13840127.8-1555/3001473 PCT/CN2013087039.

Korean Office Action dated Aug. 30, 2016; Appln. 10-2014-7010145.

Chih-Chih Lin, et al; "The Study of Blue Organic Light Emitting Diodes With A CUPC Electron Transporting Layer", Published in: Lasers and Electro-Optics, 2003. CLEO/Pacific Rim 2003. The 5th Pacific Rim Conference on (vol. 2); Dec. 15-19, 2003; 1 page.

Jiao Zhi-Qiang, et al., "Improved performance of organic light emitting diodes with dual electron transporting layers". Chinese Physical B Society and IOP Publishing Ltd., vol. 21, No. 6, Jun. 2012, 4 pages.

International Search Report dated Dec. 12, 2013; PCT/CN2013/087039.

First Chinese Office Action dated Feb. 26, 2014; Appln. No. 201310190245.0.

Chih-Chih Lin, et al; "The Study of Blue Organic Light Emitting Diodes with a CUPC Electron Transporting Layer", Published in Lasers and Electro-Optics, 2003. CLEO/Pacific Rim 2003. The 5th Pacific Rim Conference on; Date of Conference Dec. 15-19, 2003; 1 page.

Japanese Office Action dated Jun. 12, 2017; Appln. No. 2016-514245.

\* cited by examiner

ORGANIC LIGHT EMITTING DEVICE AND DISPLAY DEVICE

TECHNICAL FIELD

Embodiments of the present invention relate to an organic light emitting device and a display device.

BACKGROUND

An organic light emitting device (OLED) consists of a cathode, an anode, a hole transport layer disposed between the cathode and the anode, a light emitting layer and an electron transport layer. When a proper voltage is applied to the anode and the cathode, the holes generated at the anode and the electrons generated at the cathode are transported through the hole transport layer and the electron transport layer respectively and recombined in the light emitting layer, so that the light emitting layer emits lights of three primary colors RGB which constitute basic colors of light emitting device based on compositions of the light emitting layer.

If electron mobility of the electron transport layer is low or the energy barrier for the electron to be injected into the electron transport layer from the cathode is high, the number of the electrons in the light emitting layer of the OLED decreases, thus the number of holes is greater than the number of electrons, and the number of holes and the number of electrons do not match, which results in a low light emitting efficiency of the OLED.

SUMMARY

An embodiment of the present invention provides an OLED, comprising an anode, a cathode, and a light emitting layer disposed between the anode and the cathode; and an electron transport layer disposed between the cathode and the light emitting layer, and the material of the electron transport layer comprises an organic metal chelate.

In an example, the lowest unoccupied molecular orbital (LUMO) energy level of the organic metal chelate is −4.2 eV~−3.0 eV.

In an example, the highest occupied molecular orbital (HOMO) energy level of the organic metal chelate is greater than or equal to −6.0 eV, and a hole blocking layer is disposed between the light emitting layer and the electron transport layer.

In an example, the highest occupied molecular orbital (HOMO) energy level of the organic metal chelate is less than −6.0 eV, and the light emitting layer is in direct contact with the electron transport layer.

In an example, the lowest unoccupied molecular orbital (LUMO) energy level of the organic metal chelate is −3.9 eV~−3.3 eV.

In an example, the lowest unoccupied molecular orbital (LUMO) energy level of the organic metal chelate is greater than the lowest unoccupied molecular orbital (LUMO) energy level of the cathode and less than the lowest unoccupied molecular orbital (LUMO) energy level of the light emitting layer, and the absolute value of the difference between the lowest unoccupied molecular orbital (LUMO) energy level of the organic metal chelate and the lowest unoccupied molecular orbital (LUMO) energy level of the cathode is less than or equal to 1.2 eV.

In an example, the absolute value of the difference between the lowest unoccupied molecular orbital (LUMO) energy level of the organic metal chelate and the lowest unoccupied molecular orbital (LUMO) energy level of the cathode is less than or equal to 0.9 eV.

In an example, the absolute value of the difference between the lowest unoccupied molecular orbital (LUMO) energy level of the organic metal chelate and the lowest unoccupied molecular orbital (LUMO) energy level of the cathode is less than or equal to 0.6 eV.

In an example, the organic metal chelate comprises CuPc or ZnPc.

In an example, the anode is a patterned indium tin oxide (ITO) layer.

In an example, the OLED further comprises a hole transport layer disposed between the anode and the light emitting layer; a hole injecting layer disposed between the anode and the hole transport layer, and an electron injecting layer disposed between the electron transport layer and the cathode.

In an example, the OLED has a stacked structure connected in series.

Another embodiment of the present invention provides a display device which comprises the above OLED.

The OLED and the display device provided in the embodiments of the present invention can significantly improve the electron injecting and transport efficiency of the OLED device by using a metal chelate as the material of the electron transport layer, and in turn can balance the numbers of the holes and electrons in the light emitting layer, and significantly improve the light emitting efficiency of the device.

BRIEF DESCRIPTION OF THE DRAWINGS

In order to clearly illustrate the technical solutions of the embodiments of the invention, the drawings of the embodiments will be briefly described in the following. It is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can implement other embodiment(s), without any creative work, which should fall within the scope of the invention.

Figure 1:
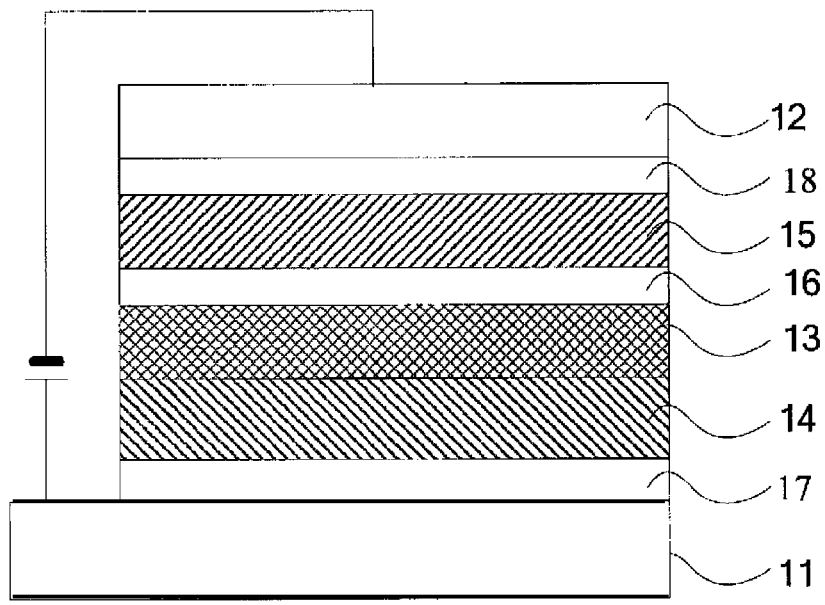
FIG. 1 is a schematic sectional view of an OLED provided in an embodiment of the present invention.

The embodiment of the present invention provides an OLED, as shown in FIG. 1. The OLED comprises an anode 11, a cathode 12, and a light emitting layer 13 disposed between the anode 11 and the cathode 12; a hole transport layer 14 disposed between the anode 11 and the light emitting layer 13, and an electron transport layer 15 disposed between the cathode 12 and the light emitting layer 13. The hole transport layer 14 is configured to transport holes generated at the anode 11 to the light emitting layer 13, and the electron transport layer 15 is configured to transport electrons generated at the cathode 12 to the light emitting layer 13. In the embodiments of the present invention, the material of the electron transport layer comprises an organic metal chelate.

The OLED provided in the embodiment of the present invention uses a metal chelate as the material of the electron transport layer so as to significantly improve electron injection and transport efficiency of the OLED device, and in turn balance the numbers of the holes and electrons in the light emitting layer, and significantly improve the light emitting efficiency of the device.

In an example, the lowest unoccupied molecular orbital (LUMO) energy level of the organic metal chelate is −4.2 eV~−3.0 eV, and the highest occupied molecular orbital (HOMO) energy level of the organic metal chelate is greater than or equal to −6.0 eV. In this case, the HOMO energy level of the organic metal chelate cannot effectively block the holes, thus, as shown in FIG. 1, a hole blocking layer 16 is disposed between the light emitting layer 13 and the electron transport layer 15. Herein it is noted that the LUMO is an electron transport energy level, and the HOMO is a hole transport energy level.

In an example, the LUMO energy level of the organic metal chelate is −4.2 eV~−3.0 eV and the HOMO energy level is less than −6.0 eV. In the case where the HOMO energy level of the organic metal chelate is less than −6.0 eV, due to strong ability of the electron transport layer to block the holes, it is not necessary to dispose the hole blocking layer, and the light emitting layer is in direct contact with the electron transport layer.

The LUMO energy level of the organic metal chelate is −4.2 eV~−3.0 eV. However, in order to form a proper energy level step between the cathode and the light emitting layer, the LUMO energy level of the organic metal chelate can be, for example, −3.9 eV~−3.3 eV; or −3.8 eV~−3.4 eV; or −3.7 eV~−3.5 eV; or −3.6 eV.

For example, the organic metal chelate can be CuPc, or ZnPc or the like.

For example, the anode is a patterned layer of indium tin oxide (ITO). Since the ITO used as the anode is patterned, such uneven surface of the ITO can avoid total reflection of lights which otherwise cannot emit out of the glass substrate due to such total reflection so as to enhance light output.

Optionally, as shown in FIG. 1, the OLED further comprises a hole injecting layer 17 disposed between the anode 11 and the hole transport layer 14, and an electron injecting layer 18 disposed between the electron transport layer 15 and the cathode 12.

For example, the anode 11 is a glass substrate with an ITO pattern. The hole injecting layer 17 can be made of a material of $MoO_3$, F4-TCNQ or the like. The hole transport layer 14 can be made of a material of NPB, TPD or the like. The light emitting layer 13 can be made of an organic polymer, an organic fluorescent or phosphorescent monomer material, or the like, and the light emitting layer can be a monochromatic, hybrid-colored light emitting layer for example a white light emitting layer. The hole blocking layer 16 can be made of an electron transport type material with a low LUMO energy level such as BCP. The electron transport layer 15 can be made of an organic metal chelate such as CuPc. The electron injecting layer 18 can be made of conventional electron injecting materials such as LiF, Liq, CsF or $Cs_2CO_3$. The cathode 12 can be made of Al. Herein it is noted that the HOMO energy level of the electron transport layer CuPc is −5.2 eV (greater than −6.0 eV), thus, it is necessary to dispose the hole blocking layer 16 between the electron transport layer 15 and the light emitting layer 13 to block the holes.

In the embodiments of the present invention, a light emitting layer with a blue color is taken as an example. The blue light emitting layer has a body of MAND (2-methyl-9,10-bis(naphthalen-2yl) anthracene), and a dopant of DSA-Ph (1-4-di-[4-(N,N-diphenyl) amino]styryl-benzene). In an example, the anode is a patterned ITO layer with a thickness of 150 nm. The hole injecting layer is made of $MoO_3$ with a thickness of 5 nm. The hole transport layer is made of NPB with a thickness of 40 nm. The blue light emitting layer is made of MAND:DSA-Ph with a thickness of 30 nm. The hole blocking layer is made of BCP with a thickness of 10 nm. The electron transport layer is made of CuPc with a thickness of 35 nm. The electron injecting layer is made of LiF with a thickness of 1 nm. The cathode is made of Al with a thickness of 120 nm.

The fabricating method of the above OLED is described as following. A transparent glass substrate with an ITO layer with a sheet resistance less than 30Ω/□ is subjected to a photolithography process to form a patterned ITO layer, then the glass substrate is cleaned sequentially with deionized water, acetone and absolute ethyl alcohol in an supersonic environment, then the cleaned substrate is blow-dried with $N_2$ and subjected to $O_2$ plasma treatment. Finally, the treated substrate is placed in an evaporation chamber. When the vacuum level is lower than $5 \times 10^{-4}$ Pa, the hole injecting layer $MoO_3$ (5 nm), the hole transport layer NPB (40 nm), the blue light emitting layer MAND:DSA-Ph (3%) (30 nm), the hole blocking layer BCP (10 nm), the electron transport layer CuPc (35 nm), the electron injecting layer LiF (1 nm) and the cathode Al (120 nm) are sequentially deposited on the patterned ITO layer by a method of vacuum thermal evaporation During the thermal evaporation, for deposition of all layers except Al, an open mask is employed at an evaporation speed of 0.1 nm/s. And for deposition of Al layer, a metal cathode mask is employed with an evaporation speed of 0.3 nm/s. The light emitting area of the device is 3 mm×3 mm.

For comparison, a comparative example of an OLED is provided. The OLED has similar functional layers as the OLED having the electron transport layer of CuPc described above, except that the OLED in the comparative example has an electron transport layer made of Bphen and is not provided with the hole blocking layer (since the HOMO energy level of Bphen is −6.4 eV less than −6.0 eV, the holes can be sufficiently blocked and it is not necessary to have the hole blocking layer). The OLED having the electron transport layer of CuPc provided in an embodiment of the present invention is compared with the OLED having the electron transport layer of Bphen in the comparative example.

In the OLED provided in the comparative example using Bphen as the electron transport layer, the LUMO energy level of the cathode (Al) and the electron injecting layer (LiF) is about −4.2 eV, the LUMO energy level of the electron transport layer (Bphen) is about −2.9 eV, and the LUMO energy level of the light emitting layer (MAND:DSA-Ph) is about −2.5 eV. Thus the energy level step between the electron transport layer Bphen (−2.9 eV) and the electron injection layer LiF (−4.2 eV) is so high that a relatively large driving voltage is needed. In the OLED provided in the embodiments of the present invention, the LUMO energy level of the cathode (Al) and the electron injecting layer (LiF) is about −4.2 eV, the LUMO energy level of the electron transport layer (CuPc) is about −3.6 eV, the LUMO energy level of the hole blocking layer (BCP) is about −3.2 eV, and the LUMO energy level of the light emitting layer (MAND:DSA-Ph) is about −2.5 eV. In this case, the electron transport layer of CuPc (−3.6 eV) provided in the embodiment of the present invention can fittingly form a proper electron transport energy level step between the electron injecting layer (−4.2 eV) and the hole blocking layer (−3.2 eV), and then the driving voltage can be effectively lowered.

More importantly, the electron mobility of CuPc can reach $9.04 \times 10^{-4}$ cm$^2$/Vs under an electric field of $3.0 \times 10^5$ V/cm, whereas the electron mobility of the current common electron transport material Bphen is $4.2 \times 10^{-4}$ cm$^2$/Vs under the electric field of $3.0 \times 10^5$ V/cm. Thus the electron transport ability of CuPc is better in comparison. That is, the OLED with CuPc as the electron transport layer has a better electron injection and transport efficiency.

Figure 2:
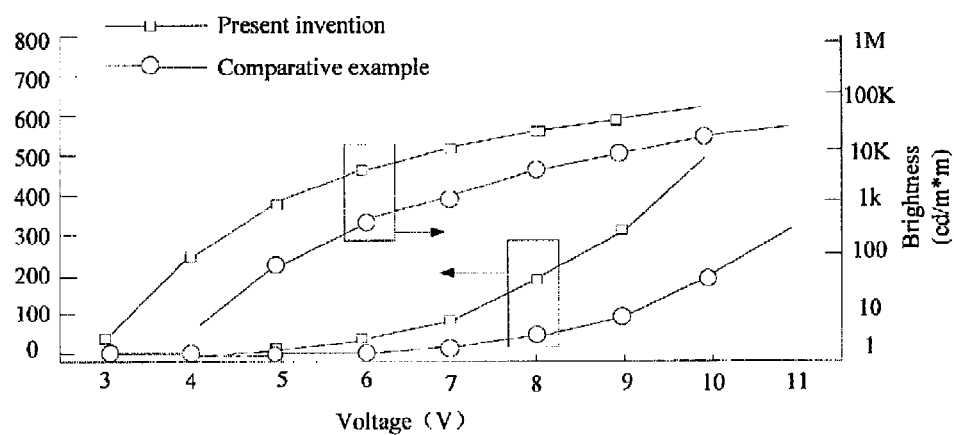
FIG. 2 is a schematic graph of current density-voltage-brightness of two devices under different driving voltages.
Figure 3:
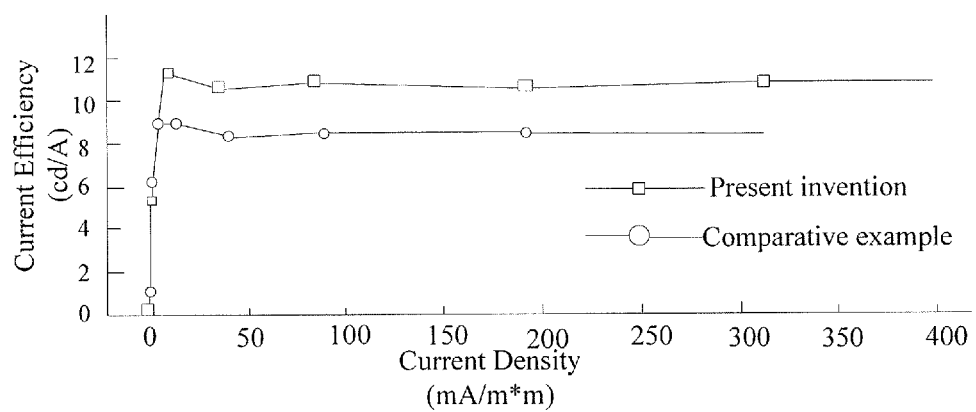
FIG. 3 is a schematic graph of current efficiency-current density of two devices under different current densities.

The device provided in the embodiments of the present invention and the device provided in the comparative example are compared through experiments and measurements hereinafter, and FIGS. 2 and 3 are obtained from experiments and measurements. FIG. 2 is a graph of the current density-voltage-brightness of two devices under different driving voltages. FIG. 3 is a graph of the current efficiency-current density of two devices under different current densities. It can be seen from the graphs that, compared with the device using the Bphen as the electron transport layer, the current density and the brightness of the device provided in the embodiments of the present invention using CuPc as the electron transport layer are improved significantly, illustrating that the electron injection efficiency of the device has been enhanced significantly. In particular, the maximum brightness of the device is enhanced by 113.4% from 26700 cd/m$^2$ to 56980 cd/m$^2$, and the maximum current efficiency is enhanced by 26.2% from 8.98 cd/A to 11.3 cd/A. It is can be seen that the device using CuPc as the electron transport layer has a greatly improved light emitting performance, compared with the device using Bphen as the electron transport layer.

In the above embodiment, a metal chelate is selected to form the electron transport layer and then a proper energy level step is formed between the cathode and the light emitting layer, and thereby the electron injection efficiency is enhanced. The LUMO value of the above metal chelate is optimized according to the LUMO energy levels of the cathode and the light emitting layer. For example, when the LUMO of the cathode or the electron injecting layer is −4.2 eV and the LUMO of the light emitting layer is −2.5 eV, a metal chelate whose LUMO is within the range of −4.2 eV~−3.0 eV can be selected. However, the cathode, the electron injecting layer and the light emitting layer according to the embodiments of the present invention are not limited to the above specific LUMO values. An embodiment according to the present invention further provides an OLED as following. The lowest unoccupied molecular orbital (LUMO) energy level of the organic metal chelate is greater than the lowest unoccupied molecular orbital (LUMO) energy level of the cathode and less than the lowest unoccupied molecular orbital (LUMO) energy level of the light emitting layer, and the absolute value of the difference between the lowest unoccupied molecular orbital (LUMO) energy level of the organic metal chelate and the lowest unoccupied molecular orbital (LUMO) energy level of the cathode is less than or equal to 1.2 eV; or, the absolute value of the difference between the lowest unoccupied molecular orbital (LUMO) energy level of the organic metal chelate and the lowest unoccupied molecular orbital (LUMO) energy level of the cathode is less than or equal to 0.9 eV; or, the absolute value of the difference between the lowest unoccupied molecular orbital (LUMO) energy level of the organic metal chelate and the lowest unoccupied molecular orbital (LUMO) energy level of the cathode is less than or equal to 0.6 eV.

For example, the OLED in the embodiment of the present invention can have a stacked structure connected in series, and the OLED elements connected in series in the stack share a common electrode as their respective anode and cathode, and this can enhance the light emitting efficiency of the device and increase service life of the device.

The embodiment of the present invention further provides a display device comprising the above OLED, and the display device can be a product or a part having a display function, such as an OLED display, an OLED display panel, a digital camera, a mobile phone, a tablet computer or an electronic paper.

The above description is only the examplatary embodiments of the present invention and not intended to limit the protection scope of the present invention, which is defined by appending claims.

The invention claimed is:

1. An organic light emitting device, comprising an anode, a cathode, a light emitting layer disposed between the anode and the cathode; and
    an electron transport layer disposed between the cathode and the light emitting layer, an electron injecting layer disposed between the electron transport layer and the cathode, and the electron transport layer comprising a material of an organic metal chelate, the electron injecting layer comprising LiF, Liq, CsF or Cs$_2$CO$_3$;
    wherein the organic metal chelate has a lowest unoccupied molecular orbital (LUMO) energy level of −3.9 eV~−3.3 eV and a highest occupied molecular orbital (HOMO) energy level less than −6.0 eV, and the light emitting layer is in direct contact with the electron transport layer,
    wherein the organic metal chelate comprises ZnPc.

2. The organic light emitting device according to claim 1, wherein the organic metal chelate has a lowest unoccupied molecular orbital (LUMO) energy level greater than a lowest unoccupied molecular orbital (LUMO) energy level of the cathode and less than a lowest unoccupied molecular orbital (LUMO) energy level of the light emitting layer, and the absolute value of the difference between the lowest unoccupied molecular orbital (LUMO) energy level of the organic metal chelate and the lowest unoccupied molecular orbital (LUMO) energy level of the cathode is less than or equal to 1.2 eV.

3. The organic light emitting device according to claim 2, wherein the absolute value of the difference between the lowest unoccupied molecular orbital (LUMO) energy level of the organic metal chelate and the lowest unoccupied molecular orbital (LUMO) energy level of the cathode is less than or equal to 0.9 eV.

4. The organic light emitting device according to claim 2, wherein the absolute value of the difference between the lowest unoccupied molecular orbital (LUMO) energy level of the organic metal chelate and the lowest unoccupied molecular orbital (LUMO) energy level of the cathode is less than or equal to 0.6 eV.

5. The organic light emitting device according to claim 1, wherein the anode is a patterned indium tin oxide (ITO) layer.

6. The organic light emitting device according to claim 1, further comprising:

a hole transport layer disposed between the anode and the light emitting layer; a hole injecting layer disposed between the anode and the hole transport layer, and an electron injecting layer disposed between the electron transport layer and the cathode.

7. The organic light emitting device according to claim 1, wherein the organic light emitting device has a stacked structure connected in series.

8. A display device, comprising an organic light emitting device comprising an anode, a cathode, a light emitting layer disposed between the anode and the cathode; and an electron transport layer disposed between the cathode and the light emitting layer, an electron injecting layer disposed between the electron transport layer and the cathode, and the electron transport layer comprising a material of an organic metal chelate, the electron injecting layer comprising LiF, Liq, CsF or $Cs_2CO_3$;

wherein the organic metal chelate has a lowest unoccupied molecular orbital (LUMO) energy level of −3.9 eV~−3.3 eV and a highest occupied molecular orbital (HOMO) energy level less than −6.0 eV, and the light emitting layer is in direct contact with the electron transport layer;

wherein the organic metal chelate comprises ZnPc.

9. The display device according to claim 8, wherein the organic metal chelate has a lowest unoccupied molecular orbital (LUMO) energy level of −4.2 eV~−3.0 eV.

10. The display device according to claim 8, wherein the organic metal chelate has a lowest unoccupied molecular orbital (LUMO) energy level greater than a lowest unoccupied molecular orbital (LUMO) energy level of the cathode and less than a lowest unoccupied molecular orbital (LUMO) energy level of the light emitting layer, and the absolute value of the difference between the lowest unoccupied molecular orbital (LUMO) energy level of the organic metal chelate and the lowest unoccupied molecular orbital (LUMO) energy level of the cathode is less than or equal to 1.2 eV.

11. The display device according to claim 10, wherein the absolute value of the difference between the lowest unoccupied molecular orbital (LUMO) energy level of the organic metal chelate and the lowest unoccupied molecular orbital (LUMO) energy level of the cathode is less than or equal to 0.9 eV.

12. The display device according to claim 10, wherein the absolute value of the difference between the lowest unoccupied molecular orbital (LUMO) energy level of the organic metal chelate and the lowest unoccupied molecular orbital (LUMO) energy level of the cathode is less than or equal to 0.6 eV.

* * * * *